US006954623B2

(12) United States Patent
Chang et al.

(10) Patent No.: US 6,954,623 B2
(45) Date of Patent: Oct. 11, 2005

(54) LOAD VARIATION TOLERANT RADIO FREQUENCY (RF) AMPLIFIER

(75) Inventors: Shiaw W. Chang, Thousand Oaks, CA (US); Hugh J. Finlay, Moorpark, CA (US); Nai-Shuo Cheng, Simi Valley, CA (US); Bon-Seok Park, Thousand Oaks, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 101 days.

(21) Appl. No.: 10/392,344

(22) Filed: Mar. 18, 2003

(65) Prior Publication Data

US 2004/0185916 A1 Sep. 23, 2004

(51) Int. Cl.[7] .................................................. H04B 1/04
(52) U.S. Cl. .............................. 455/127.1; 455/253.2; 455/127.2; 330/124 R; 330/132
(58) Field of Search .......................... 455/127.1, 127.3, 455/276.1, 304, 305, 139, 296, 303, 273, 103, 137–144, 344, 253.2, 133, 127.2, 140, 135, 136, 138, 143, 194.2, 232.1, 234.1, 239.1–252.1, 311, 319, 341, 91, 126, 191.1, 132, 280; 330/124 R, 307, 144, 286–298, 155, 302, 310, 54, 151, 152, 277, 285, 300, 301, 125, 127, 128, 136, 132, 53, 107, 149, 269, 51; 333/124, 109, 113–116, 128, 136, 125, 127, 32, 33; 342/372, 157

(56) References Cited

U.S. PATENT DOCUMENTS 4,803,443 A * 2/1989 Takagi et al. ................ 330/277

| | | | | |
|---|---|---|---|---|
| 5,786,727 A | * | 7/1998 | Sigmon | 330/124 R |
| 5,966,059 A | * | 10/1999 | Sigmon | 333/128 |
| 6,643,500 B1 | * | 11/2003 | Erhage et al. | 455/276.1 |
| 6,650,200 B2 | * | 11/2003 | Culliton et al. | 333/124 |
| 2004/0185916 A1 | * | 9/2004 | Chang et al. | 455/572 |

OTHER PUBLICATIONS

A Low Distortion and High Efficiency Parallel–Operation Power Amplifier Combined in Different Phases in Wide Range of Load Impedances, Ikeda, et al., *1996 IEEE MTT–S Digest*, pp. 535–538.

A 3.2–V Operation Single–Chip Dual–Band AlGaAs/GaAs HBT MMIC Power Amplifier with Active Feedback Circuit Technique, Yamamoto, et al., *IEEE Journal of Solid–State Circuits*, vol. 35, No. 8, Aug. 2000, pp. 1109–1120.

A Low Distortion and High Efficiency Parallel–Operation Power Amplifier Combined in Different Phases in Wide Range of Load Impedances, Ikeda, et al., *1996 IEEE MTT–S Digest*, pp. 535–538.

A 3.2–V Operation Single–Chip Dual–Band AlGaAs/GaAs HBT MMIC Power Amplifier with Active Feedback Circuit Technique, Yamamoto, et al., *IEEE Journal of Solid–State Circuits*, vol. 35, No. 8, Aug. 2000, pp. 1109–1120.

* cited by examiner

*Primary Examiner*—Edward F. Urban
*Assistant Examiner*—Charles Chow

(57) ABSTRACT

A power amplifier having a phase shift and impedance transformation element is disclosed. The power amplifier comprises a plurality of amplification paths, a first phase shift element at an input of each amplification path and a second phase shift element at an output of each amplification path. The amplifier also comprises an impedance transformation element associated with the second phase shift element and a power combiner configured to combine an output of each amplification path into a single output.

24 Claims, 3 Drawing Sheets

LOAD VARIATION TOLERANT RADIO FREQUENCY (RF) AMPLIFIER

BACKGROUND OF THE INVENTION

1. Field of the Invention

This invention relates generally to the generation and control of radio frequency (RF) transmission power, minimizing cost, and reducing the size of a portable communications device. More particularly, the invention relates to an RF amplifier that is tolerant to load variation.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and/or data communications in a handheld, telephone-like communication transceiver, a wireless personal digital assistant (PDA) or computer interface. While the different modulation and transmission schemes each have advantages and disadvantages, common goals for all of these devices is minimizing the size and cost of the handset, while maximizing the performance of the transceiver.

Minimizing the size and cost of a portable communication transceiver are typically the greatest challenges facing the designers of such devices. While many different approaches have been investigated, oftentimes the greatest opportunity for minimizing both the size and cost of the transceiver is by reducing the number of components in the transceiver. One of the devices that typically include a moderate number of components, and hence provides an opportunity for component number reduction, is the RF power amplifier. The RF power amplifier accepts the RF transmit signal and amplifies this transmit signal for transmission via the antenna associated with the transceiver.

Conventional RF power amplifiers may include multiple stages and, in some applications, include multiple amplification paths. In some configurations this multiple path arrangement is referred to as a "balanced amplifier." Regardless of the architecture, conventional balanced power amplifiers require coupling circuitry to combine the outputs of multiple paths together. Further, because the load presented to the power amplifier changes with variations in the antenna impedance, conventional RF power amplifiers, whether those that use a single or dual path amplification scheme, generally employ one or more isolators at the output of the amplifier. Antenna impedance changes continuously depending on the location and operating mode of the transceiver. For example, the impedance of the antenna may vary between, for example, 5 and 50 ohms, depending on the location of the transceiver. Without a protective isolator or other special protective circuitry, this variation in the impedance presented to the power amplifier causes the performance of the power amplifier to vary, thus degrading overall performance of the transceiver. The isolator minimizes the impedance variation presented to the output stage of the power amplifier. Unfortunately, the isolator is a relatively large and costly component that, because of the possibility of physical contamination, is difficult to integrate onto the same structure on which the power amplifier is fabricated.

Therefore, it would be desirable to remove the isolator from the transceiver, while allowing the power amplifier to operate over a wide range of operating conditions.

SUMMARY

A power amplifier having a phase shift and impedance transformation element is disclosed. The power amplifier comprises a plurality of amplification paths, a first phase shift element at an input of each amplification path and a second phase shift element at an output of each amplification path. The amplifier also comprises an impedance transformation element associated with the second phase shift element and a power combiner configured to combine an output of each amplification path into a single output.

Related systems and methods of operation are also provided. Other systems, methods, features, and advantages of the invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the phase shift and impedance transformation element and/or the power combiner and impedance transformation element can be implemented in any balanced power amplification system where it is desirable to minimize cost and/or size by eliminating one or more isolators at the output of the power amplifier. In a preferred embodiment, the power amplifier including the phase shift and impedance transformation element and the power combiner and impedance transformation element are implemented in hardware, as will be described below. The hardware portion of the invention can be implemented using specialized hardware elements and logic. Furthermore, the hardware implementation of the phase shift and impedance transformation element, as well as the power combiner and impedance transformation element can include any or a combination of the following technologies, which are all well known in the art: discrete circuit components and elements, integrated circuit components and elements, a combination of discrete components and integrated circuit components, transmission lines and/or transmission line components or elements, a discrete logic circuit(s) having logic gates for implementing logic functions upon data signals, an application specific integrated circuit having appropriate logic gates, a programmable gate array(s) (PGA), a field programmable gate array (FPGA), etc.

Figure 1:
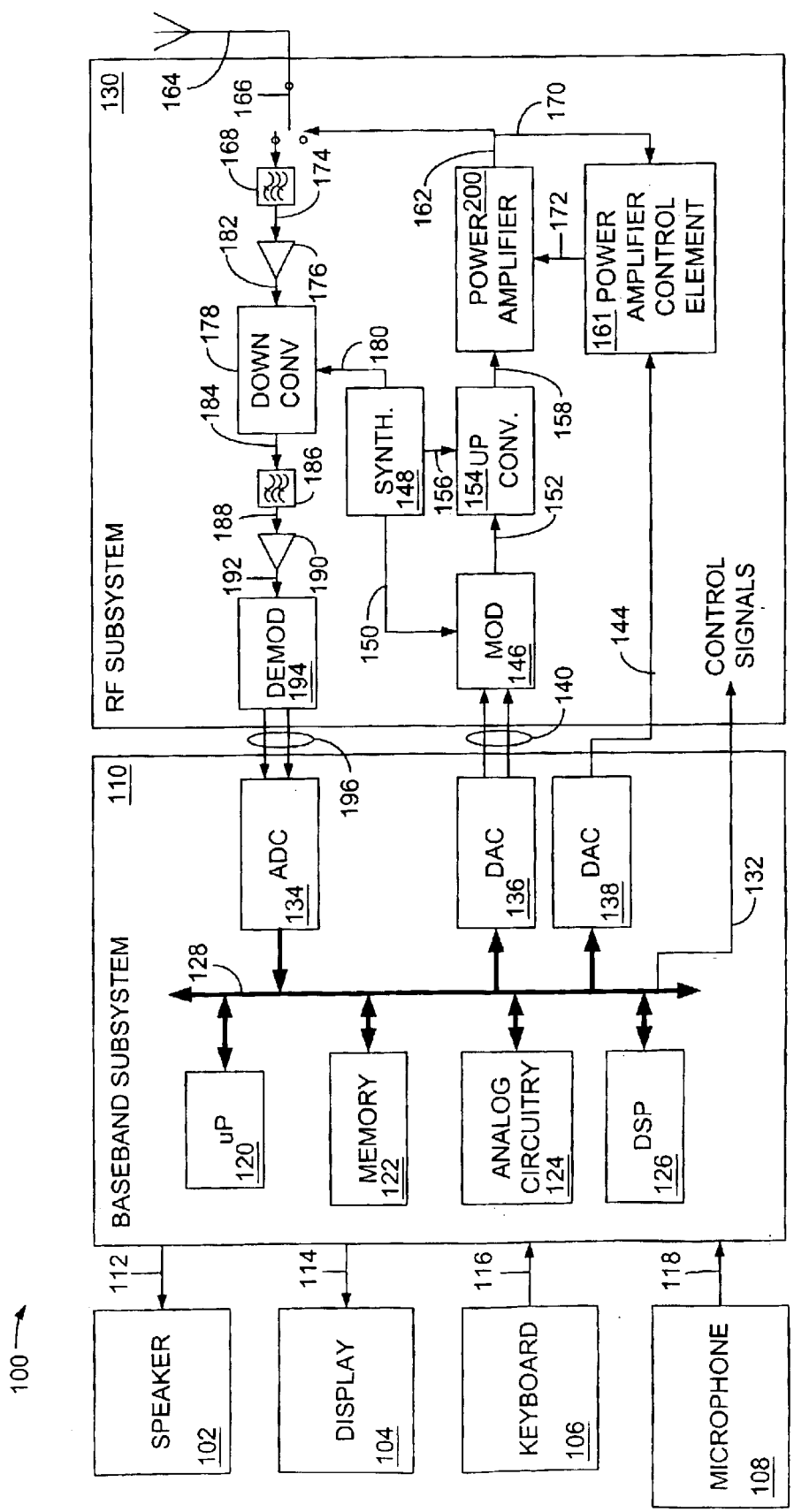
FIG. 1 is a block diagram illustrating a simplified portable transceiver including a power amplifier in accordance with an embodiment of the invention.

FIG. 1 is a block diagram illustrating a simplified portable transceiver including a power amplifier in accordance with an embodiment of the invention. Portable transceiver 100 includes speaker 102, display 104, keyboard 106, and microphone 108, all connected to baseband subsystem 110. In a particular embodiment, portable transceiver 100 can be, for example, but not limited to, a portable telecommunication handset such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (μP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110. Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to radio frequency (RF) subsystem 130 via connection 132. Although shown as a single connection 132, the control signals may originate from DSP 126 or from microprocessor 120, and are supplied to a variety of points within RF subsystem 130. It should be noted that, for simplicity, only the basic components of portable transceiver 100 are illustrated.

Baseband subsystem 110 also includes analog-to-digital converter (ADC) 134 and digital-to-analog converters (DACs) 136 and 138. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to RF subsystem 130 via connection 140. DAC 138 provides a reference voltage power level signal to power amplifier control element 161 via connection 144. The operation of the DACs 136 and 138 may also be combined into a single device. Connection 140, while shown as two directed arrows, includes the information that is to be transmitted by RF subsystem 130 after conversion from the digital domain to the analog domain.

RF subsystem 130 includes modulator 146, which, after receiving a frequency reference signal, also called a "local oscillator" signal, or "LO," from synthesizer 148 via connection 150, modulates the received analog information and provides a modulated signal via connection 152 to upconverter 154. The modulated transmit signal may include only phase information, only amplitude information, or both phase and amplitude information, depending on the desired transmit format. Upconverter 154 also receives a frequency reference signal from synthesizer 148 via connection 156. Synthesizer 148 sets the frequency to which upconverter 154 upconverts the modulated signal on connection 152.

Upconverter 154 supplies the modulated signal via connection 158 to power amplifier 200. Power amplifier 200 amplifies the modulated signal on connection 158 to the appropriate power level for transmission via connection 162 to antenna 164. Illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132. Alternatively, the switch 166 may be replaced by a filter (e.g., a duplexer) that allows simultaneous passage of both transmit signals and receive signals, as known to those having ordinary skill in the art.

The power amplifier 200 is preferably arranged in what is referred to as a "balanced amplifier" architecture. As will be described below, the power amplifier 200 includes a phase shift and impedance transformation circuitry, and power combiner and impedance transformation circuitry, which allow the power amplifier 200 to remain highly tolerant to load variation (also referred to as impedance variation) at the output of the power amplifier 200.

A portion of the amplified transmit signal energy on connection 162 is supplied via connection 170 to power amplifier control element 161. The power amplifier control element 161 may form a closed loop output power controller utilizing feedback to control the output power of power amplifier 160 and may also supply a power control signal to the power amplifier 200 via connection 172.

A signal received by antenna 164 will be directed to receive filter 168. Receive filter 168 will filter the received signal and supply the filtered signal on connection 174 to low noise amplifier (LNA) 176. Receive filter 168 is a band pass filter, which passes all channels of the particular cellular system in which the portable transceiver 100 is operating. As an example, for an 1800 MHz PCS CDMA, receive filter 168 would pass all frequencies from 1930.00 MHz to 1989.950 MHz, covering 250 channels of 1.25 MHz each. The purpose of this filter is to reject all frequencies outside the desired region. LNA 176 amplifies the very weak signal on connection 174 to a level at which downconverter 178 can transform the signal from the transmitted frequency to a baseband frequency. Alternatively, the functionality of LNA 176 and down-converter 178 can be accomplished using other elements, such as, for example but not limited to, a low noise block downconverter (LNB), or a direct conversion receiver (DCR).

Downconverter 178 receives a frequency reference signal, also called a "local oscillator" signal, or "LO," from synthesizer 148, via connection 180. The LO signal sets the proper frequency for downconverting the signal received from LNA 176 via connection 182 by the downconverter 178. The downconverted frequency is called the intermediate frequency or IF. Downconverter 178 sends the downconverted signal via connection 184 to channel filter 186, also called the "IF filter." Channel filter 186 filters the downconverted signal and supplies it via connection 188 to amplifier 190. The channel filter 186, using inputs from control signal 132, selects the one desired channel and rejects all others. Using the PCS CDMA system as an example, only one of the 250 channels is actually to be received. After all channels are passed by receive filter 168 and downconverted in frequency by downconverter 178, only the one desired channel will appear precisely at the center frequency of channel filter 186. The synthesizer 148, by controlling the local oscillator frequency supplied on connection 180 to downconverter 178, sets the center of the desired channel to the center of the channel filter 186. Amplifier 190 amplifies the received signal and supplies the amplified signal via connection 192 to demodulator 194. Demodulator 194 recovers the transmitted analog information and supplies a signal representing this information via connection 196 to ADC 134. ADC 134 converts this analog signal to a digital signal at baseband frequency and transfers the signal via bus 128 to DSP 126 for further processing.

The foregoing description of the receiver components is for exemplary purposes only. Indeed, other receiver architectures, such as, for example but not limited to, a super heterodyne receiver, a direct conversion receiver, or a sampling receiver, are contemplated to be within the scope of the invention.

Figure 2:
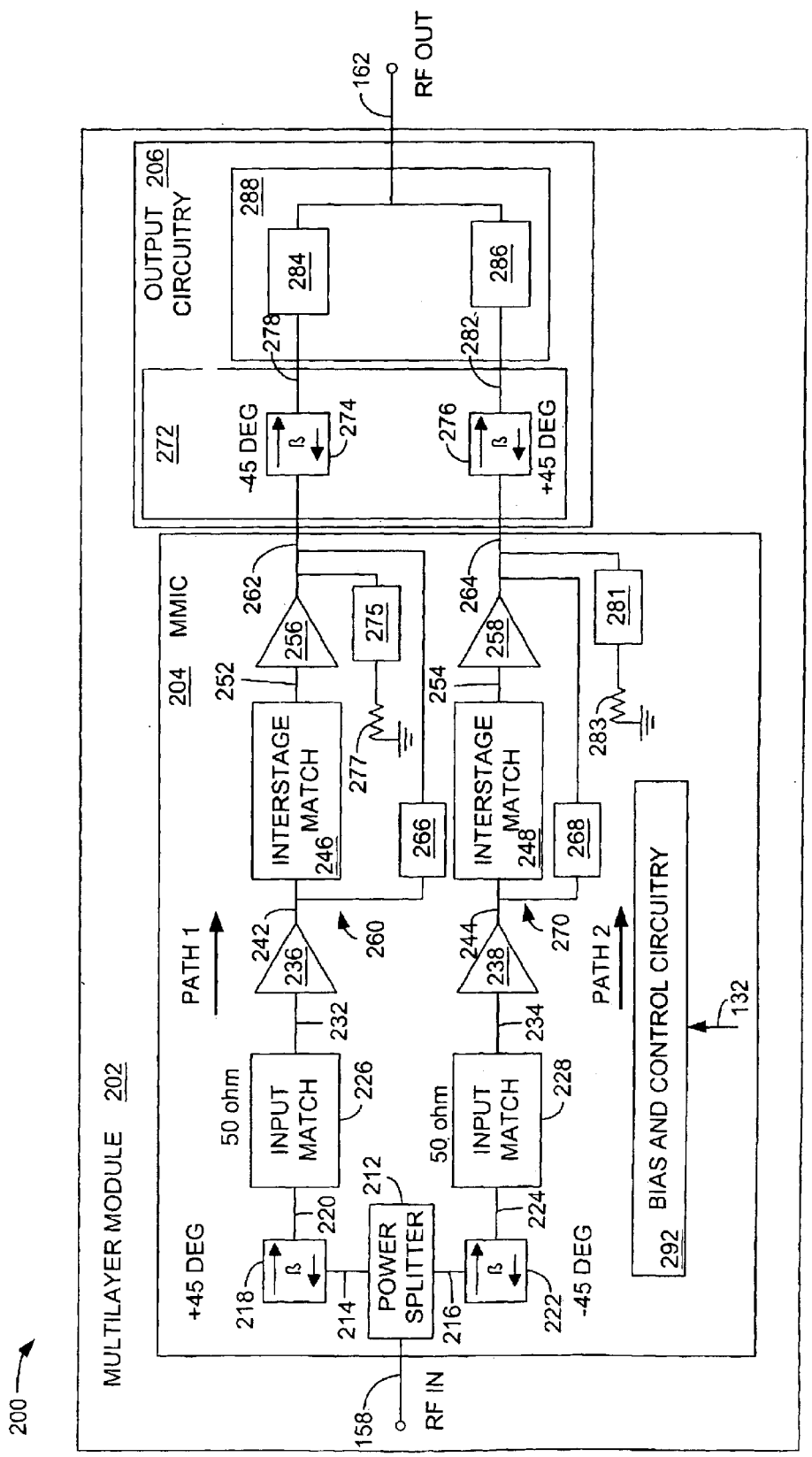
FIG. 2 is a block diagram illustrating the power amplifier of FIG. 1.

FIG. 2 is a block diagram illustrating the power amplifier 200 of FIG. 1. The power amplifier 200 can be fabricated on what is referred to as a "multilayer module" 202. The multilayer module 202 incorporates at least one monolithic microwave integrated circuit (MMIC) 204 and output circuitry 206 located on the multilayer module 202. The output circuitry 206 incorporates a phase shift and impedance transformation element 272 and a power combiner and impedance transformation element 288. The impedance provided by either or both of these elements provides output impedance matching for the MMIC 204.

The overall architecture of the power amplifier 200 is referred to as a "balanced amplifier". In this example, a first amplification path is referred to as "path 1" and generally comprises phase shift element 218, input matching element 226, first stage amplifier 236, interstage matching element 246 and second stage power amplifier 256. A second amplification path is referred to as "path 2" and generally comprises phase shift element 222, input matching element 228, first stage amplifier 238, interstage matching element 248 and second stage power amplifier 258. Additional amplification paths can also be provided and are included within the scope of the invention.

The amplifiers 236, 238 256 and 258 can be fabricated using, for example, one or more of the following technologies: heterojunction bipolar transistor (HBT) amplifiers, bipolar junction transistor (BJT) amplifiers, field effect transistor (FET) amplifiers, pseudomorphic high electron mobility transistor (PHEMT) amplifiers, or any other suitable amplifier technology.

The MMIC 204 receives a radio frequency (RF) communication signal via connection 158. The signal on connection 158 is referred to as an input signal and contains the information that is to be transmitted by the portable transceiver 100. The RF input signal on connection 158 is supplied to a power divider 212. The power divider 212 substantially equally divides the signal on connection 158 onto connection 214 to phase shift element 218, and onto connection 216 to phase shift element 222. If additional amplification paths were included, the power divider 212 would divide the input signal substantially proportionally among all of the amplification paths.

The power divider 212 is an in-phase power divider that produces signals on connections 214 and 216 having substantially the same phase. In an alternative implementation, the power divider may provide outputs on connections 214 and 216 that differ by 180°. Such a power divider may comprise a passive 180° splitter or an active 180° power divider, or splitter, implemented using one or more semiconductor devices or other active elements. Such an implementation using active circuitry may reduce the size of the components and may also provide increased isolation between path 1 and path 2. For this alternative implementation, the phase shift element 218 applies a −45° phase shift to the signal on connection 214 and the phase shift element 222 applies a +45° phase shift to the signal on connection 216. The phase shift elements 218 and 222 may comprise discrete circuit components and elements, integrated circuit components and elements, a combination of discrete components and integrated circuit components, transmission lines and/or transmission line components or elements.

The phase shift element 218 applies a +45° phase shift to the signal on connection 214 and the phase shift element 222 applies a −45° phase shift to the signal on connection 216. Alternatively, different degrees of phase shift may be applied by the phase shift elements 218 and 222. The phase shift elements 218 and 222 may comprise discrete circuit components and elements, integrated circuit components and elements, a combination of discrete components and integrated circuit components, transmission lines and/or transmission line components or elements. The output of the phase shift element 218 is supplied via connection 220 to the input matching element 226 and the output of phase shift element 222 is supplied via connection 224 to the input matching elements 228. The input matching element 226 provides impedance matching between the phase shift element 218 and preceding circuitry (not shown), and the input to first stage amplifier 236. Similarly, the input matching element 228 provides impedance matching between the phase shift element 222 and preceding circuitry (not shown), and the input to first stage amplifier 238. Accordingly, the output of the input matching element 226 is supplied via connection 232 to first stage amplifier 236 and the output of input matching element 228 is supplied via connection 234 to first stage amplifier 238.

The output of first stage amplifier 236 is supplied via connection 242 to interstage matching element 246 and the output of first stage amplifier 238 is supplied via connection 244 to interstage matching element 248. The interstage matching element 246 provides impedance matching between the first stage amplifier 236 and the second stage power amplifier 256. The interstage matching element 248 provides impedance matching between the first stage amplifier 238 and the second stage power amplifier 258. The output of interstage matching element 246 is supplied via connection 252 to second stage power amplifier 256 and the output of interstage matching element 248 is supplied via connection 254 to second stage amplifier 258.

The input matching elements 226 and 228, and the interstage matching elements 246 and 248 typically comprise one or more inductive (L) elements, capacitive (C) elements, resistive (R) elements and/or transmission lines, the values of which are chosen to provide optimal impedance matching for the particular circuitry.

A portion of the output power of the second stage power amplifier 256 on connection 262 and 258 on connection 264 is supplied to control circuitry that may comprise, for example, an active feedback loop, switchable impedance, or any other circuit suitable for adjusting the respective gain of the two amplification paths.

If implementing an active feedback loop, one possible implementation is that a portion of the output power from the second stage power amplifier 256 on connection 262 is supplied to active feedback loop 260 and a portion of the output power from the second stage power amplifier 258 on connection 264 is supplied to active feedback loop 270. The active feedback loops 260 and 270 include active switches 266 and 268, respectively, which can be implemented using various known topologies, for example, various combinations of resistive and capacitive components. The active feedback loops 260 and 270 compensate for power gain imbalance caused by antenna load variation at the output of the power amplifier 200 by adjusting the gain of each of the amplification paths on the MMIC 204.

If implementing a switchable impedance control method, a portion of the output power of the second stage power amplifier 256 on connection 262 is supplied in shunt to active switch 275. The active switch 275 is connected in series to one or more resistors, an exemplary one of which is illustrated using reference numeral 277. Alternatively, the circuitry may include, for example, transmission lines, an inductive (L)/capacitive (C) network, or other circuitry to provide an RF impedance change. The resistor 277 is tied to ground. In a similar manner, a portion of the output power of the second stage power amplifier 258 on connection 264 is supplied in shunt to active switch 281. The active switch 281 is connected in series to one or more resistors, transmission lines, an L/C network, or other circuitry to provide an RF impedance change. For illustration, the circuitry comprises a resistor an exemplary one of which is illustrated using reference numeral 283. The resistor 283 is tied to ground. The active switches 275 and 281 can be similar to the active switches 266 and 268, described above. The active switches 275 and 281 detect high versus low load impedance and switch to the impedance best suited to providing good overall power amplifier performance.

Movement of the portable communication transceiver 100 within the communication cell, and positional changes of the antenna 164 of the portable transceiver 100 alters the impedance between the output of the power amplifier 200 and the antenna 164 (FIG. 1) of the portable transceiver 100. As the impedance between the power amplifier and the antenna changes, the mismatch also changes resulting in changes in the performance of the circuitry within power amplifier 200. These performance changes are most significant regarding the differing gains between path 1 and path 2. Because of this gain difference, spectral regrowth tends to occur, which degrades signal quality in or during power amplifier-to-antenna impedance mismatch conditions. Spectral regrowth tends to increase the noise floor of the communication system in which the portable transceiver 100 is operating. The active feedback loops 260 and 270 reduce the spectral regrowth by equalizing the gain between the amplification paths in response to the varying impedance at the output of the power amplifier 200. Reducing spectral regrowth reduces the noise contributed to the communication system by the power amplifier 200.

The output of the second stage power amplifier 256 is supplied via connection 262 and the output of the second stage power amplifier 258 is supplied via connection 264 to the output circuitry 206.

The output circuitry 206 includes a phase shift and impedance transformation element 272 and a power combiner and impedance transformation element 288. Element 272 comprises a phase shift and impedance transformation element for each of amplification path 1 and amplification path 2 and will be described in greater detail with respect to FIG. 3. With regard to FIG. 2, the phase shift and impedance transformation element 272 includes phase shift and impedance transformation element 274 and phase shift and impedance transformation element 276. The phase shift and impedance transformation elements 274 and 276 may include, for example, discrete circuit components and elements, integrated circuit components and elements, a combination of discrete components and integrated circuit components, transmission lines and/or transmission line components or elements. The output of the MMIC 204 on connection 262 is supplied to the phase shift and impedance transformation element 274 while the output of the MMIC 204 on connection 264 is supplied to the phase shift and impedance transformation element 276. The phase shift and impedance transformation elements 274 and 276 apply an opposite phase correction to the signals on connections 262 and 264, respectively, and also transform the impedance of the signals on connections 262 and 264. The phase shift and impedance transformation may occur simultaneously or separately. The operation of the phase shift and impedance transformation elements 272 and 276 will be described in greater detail with respect to FIG. 3. The phase shift and impedance transformation element 274 applies a −45° phase shift (which is opposite the phase shift applied by the phase shift element 218) and the phase shift and impedance transformation element 276 applies a +45° phase shift to the signal on connection 264 (which is opposite the phase shift applied by the phase shift element 222).

The output of the phase shift and impedance transformation element 274 is supplied via connection 278 to the power combiner and impedance transformation element 284 and the output of the phase shift and impedance transformation element 276 is supplied via connection 282 to the power combiner and impedance transformation element 286. Although illustrated using separate blocks, the elements 284 and 286 can be implemented using common elements, as will be described below. The power combiner and impedance transformation element 288, comprises a dual-purpose circuit element providing both additional output impedance matching and power combination. The power combiner and impedance transformation element 288, which can incorporate a Wilkinson power combiner, combines the power on connections 278 and 282 and provides the RF output signal on connection 162.

Figure 3:
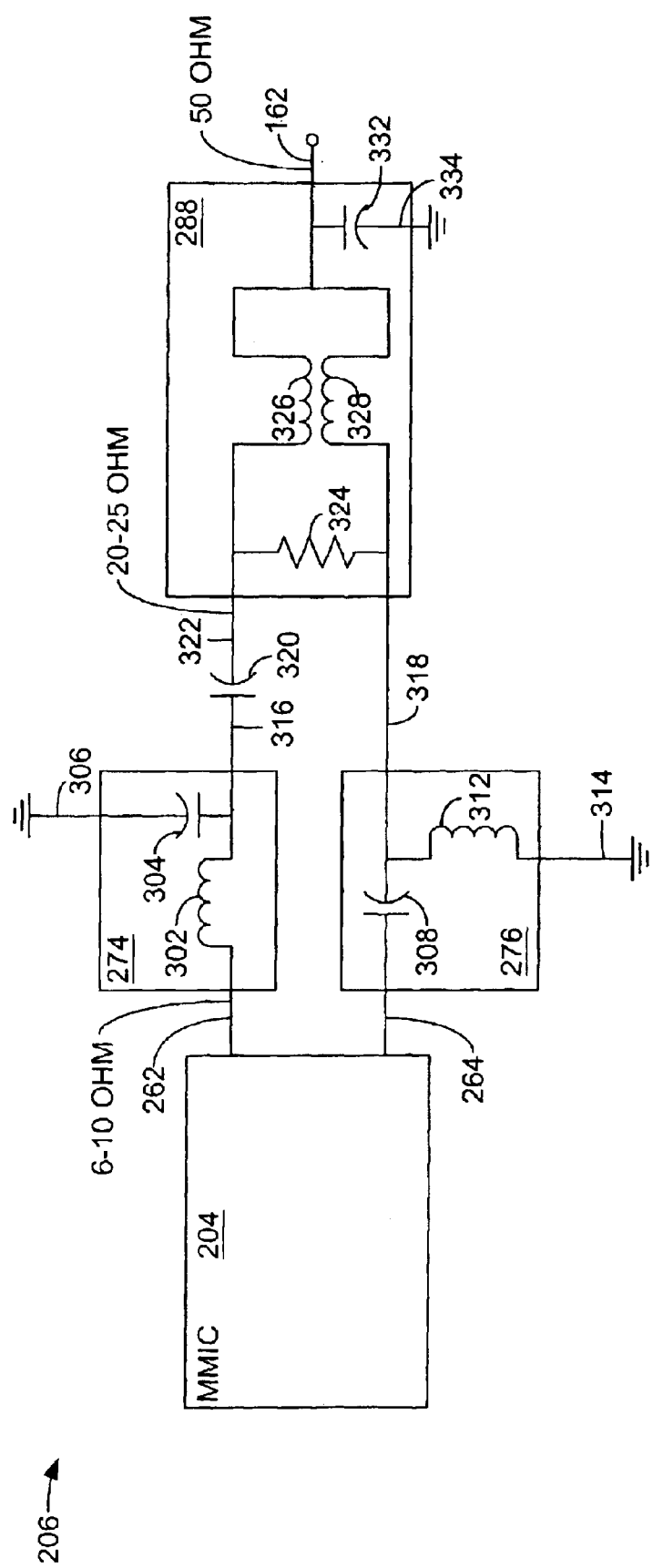
FIG. 3 is a block diagram illustrating the output circuitry of FIG. 2.

FIG. 3 is a block diagram 300 illustrating, in greater detail, the output circuitry 206 of FIG. 2. The output of the MMIC 204 is supplied via connection 262 to the phase shift and impedance transformation element 274 and the output of the MMIC 204 on connection 264 is supplied to the phase shift and impedance transformation element 276. Although omitted for simplicity, DC feedthrough and harmonics tuning circuitry, as known in the art, is coupled to the connections 262 and 264.

While the component minimized embodiment shown in FIG. 3 is one possible implementation of the output circuitry 206, many other embodiments are possible. The phase shift and impedance transformation element 274 includes an inductive element (illustrated as an inductor) 302 coupled in parallel to a capacitive element (illustrated as a capacitor) 304. The capacitive element 304 is coupled via connection 306 to ground. The phase shift and impedance transformation element 276 includes a capacitive element (illustrated as a capacitor) 308 and a parallel-coupled inductive element (illustrated as an inductor) 312. The inductive element 312 is coupled via connection 314 to ground.

The inductive element 302 applies a −45° phase shift while the capacitive element 308 applies a +45° phase shift to the signals on connections 262 and 264, respectively. The capacitive element 304 and the inductive element 302 perform an impedance transformation on the signal on connection 262. Similarly, inductive element 312 and the capacitive element 308 perform an impedance transformation on the signal on connection 264. For example, if the impedance of the signals on connections 262 and 264 are at, for example, 6–10 ohms, then, the phase shift and impedance transformation element 274 applies a −45° phase shift while transforming the impedance on the connection 262 to, for example, 20–25 ohms. Similarly, the phase shift and impedance transformation element 276 applies a +45° phase shift while transforming the impedance on the connection 264 to, for example, 20–25 ohms. The phase shift and the impedance transformation may occur simultaneously or separately.

The output of the phase shift and impedance transformation element 274 on connection 316 is supplied to a capacitor 320. The capacitor 320 blocks direct current (DC) levels from the signal on connection 316. The signal on connections 322 and 318 are then supplied to the power combiner and impedance transformation element 288. By appropriately selecting the components and component values for the elements in the phase shift and impedance transformation element 272 and the power combiner and impedance transformation element 288, impedance mismatch at the output of the power amplifier 200 can be compensated, without the need for an isolator at the output of the power amplifier 200.

When there is an impedance mismatch between the output of the power amplifier and the antenna, in one path (for example path 1) the impedance transformation results in an inductive rotation on a Smith chart, and in the other path (for example, path 2) the impedance transformation results in a capacitive rotation on a Smith chart. A Smith chart is a graphical representation of a complex number nomograph presented in a circular format that is used to display RF circuit performance parameters. The disparate rotation results in one path presenting a low impedance to the output of the power amplifier, 256 or 258, and the other path presenting a high impedance to the output of the power amplifier, 256 or 258. The determination of which paths presents an inductive rotation and which path presents a capacitive rotation is arbitrary to the principles of the invention. Although other situations are possible, in this case because of the characteristics of the power amplifiers 256 and 258, the path with the low impedance will have good performance, and hence a good adjacent channel power rejection (ACPR). The path with the high impedance will have poor performance, and hence a poor ACPR. The combination of the signal from the two paths by the power combiner and impedance transformation element 288 results in ACPR performance that lies between the ACPR performance of the path with high impedance (and therefore relatively poor ACPR performance) and the ACPR performance of the path having low impedance (and therefore relatively good ACPR performance), which results in favorable overall ACPR system performance.

In this manner, the power amplifier is highly tolerant to variations in the load at the output 162 of the power amplifier 200.

In this embodiment, the power combiner and impedance transformation element 288 includes a resistor 324, a pair of inductors 326 and 328, and a capacitor 332 coupled to ground via connection 334. The power combiner and impedance transformation element 288 performs a further impedance transformation in that appropriate selection of the values of the resistor 324, inductors 326 and 328 and capacitor 332 transforms the impedance of the signal on connections 322 and 318 from approximately 20–25 ohms to 50 ohms on connection 162 in this example. The output of the power combiner and impedance transformation element 288 on connection 162 is the RF output of the power amplifier 200 of FIG. 2.

An alternative implementation for the phase shift elements 218 and 222, and for the phase shift and impedance transformation elements 274 and 276, comprises one or more higher order lumped element networks using inductive (L) and capacitive (C) components. Such an implementation may provide increased bandwidth and reduced sensitivity to component manufacturing tolerance variations. Another alternative implementation uses compact transmission lines in series or shunt combinations in place of and/or in addition to the phase shift elements 218 and 222, and the phase shift and impedance transformation elements 274 and 276. These alternative implementations also provide a 90° net phase difference between the amplification paths, as described above. Furthermore, all of the discrete components described above may be integrated, or embedded, onto the multilayer module 202.

The phase shift and impedance transformation elements and/or the power combiner and impedance transformation element allow the elimination of the isolator that is typically present at the RF output 162. Accordingly, the size and cost of the power amplifier 200 can be significantly reduced while still allowing the power amplifier 200 to remain highly tolerant to variations in the load on connection 162 (i.e., the impedance on connection 162).

While various embodiments of the invention have been described, it will be apparent to those of ordinary skill in the art that many more embodiments and implementations are possible that are within the scope of this invention. For example, the phase shift and impedance transformation and/or the power combiner and impedance transformation elements can be used in PDAs wireless networking implementations, base stations, and other wireless mobile communication applications. Accordingly, the invention is not to be restricted except in light of the attached claims and their equivalents.

What is claimed is:

1. An integrated power amplifier, comprising:
   a plurality of amplification paths;
   a first phase shift element at an input of each amplification path;
   a second phase shift element at an output of each amplification path;
   an impedance transformation element associated with the second phase shift element;
   a power combiner configured to combine an output of each amplification path into a single output, wherein the first phase shift element, the second phase shift element, the impedance transformation element and the power combiner are integrated on a single multi-layer module; and
   an active switch associated with each amplification path, each active switch configured to detect impedance of its respective amplification path and select an amplification path based on the detected impedance.

2. The circuit of claim 1, wherein the first phase shift element applies a phase shift substantially opposite the phase shift applied by the second phase shift element and wherein the phase shift applied by the first phase shift element and the second phase shift element in each amplification path is substantially opposite the phase shift applied by the first phase shift element and the second phase shift element in another amplification path.

3. The circuit of claim 1, wherein the impedance transformation element and the second phase shift element associated with each amplification path are combined into a single device.

4. The circuit of claim 3, wherein the impedance transformation element and the second phase shift element substantially simultaneously alter the phase and impedance of a signal.

5. The circuit of claim 3, wherein the impedance transformation element and the second phase shift element separately alter the phase and impedance of a signal.

6. The circuit of claim 3, wherein the impedance transformation element and the second phase shift element are located on the same module as the plurality of amplification paths.

7. The circuit of claim 6, wherein the impedance transformation element and the second phase shift element comprise an inductive (L) and capacitive (C) circuit.

8. The circuit of claim 1, wherein under an impedance mismatch condition one amplification path has a high impedance and the other amplification path has a low impedance.

9. The circuit of claim 1, wherein the power combiner further comprises an additional impedance transformation element.

10. A portable communication transceiver, comprising:
- a balanced power amplifier having a plurality of amplification paths;
- a first phase shift element at an input of each amplification path;
- a second phase shift element at an output of each amplification path;
- an impedance transformation element associated with the second phase shift element;
- a power combiner configured to combine an output of each amplification path into a single output, wherein the first phase shift element, the second phase shift element, the impedance transformation element and the power combiner are integrated on a single multi-layer module; and
- an active switch associated with each amplification path, each active switch configured to detect impedance of its respective amplification path and select an amplification path based on the detected impedance.

11. The transceiver of claim 10, wherein the first phase shift element applies a phase shift substantially opposite the phase shift applied by the second phase shift element and wherein the phase shift applied by the first phase shift element and the second phase shift element in each amplification path is substantially opposite the phase shift applied by the first phase shift element and the second phase shift element in another amplification path.

12. The transceiver of claim 10, wherein the impedance transformation element and the second phase shift element associated with each amplification path are combined into a single device.

13. The transceiver of claim 12, wherein the impedance transformation element and the second phase shift element substantially simultaneously alter the phase and impedance of a signal.

14. The transceiver of claim 12, wherein the impedance transformation element and the second phase shift element separately alter the phase and impedance of a signal.

15. The transceiver of claim 12, wherein the impedance transformation element and the second phase shift element are located on the same module as the plurality of amplification paths.

16. The transceiver of claim 15, wherein the impedance transformation element and the second phase shift clement comprise an inductive (L) and capacitive (C) circuit.

17. The transceiver of claim 10, wherein under an impedance mismatch condition one amplification path has a high impedance and the other amplification path has a low impedance.

18. The transceiver of claim 10, wherein the power combiner further comprises an additional impedance transformation element.

19. A method for altering the impedance of a power amplifier, comprising:
- providing a plurality of amplification paths;
- supplying a signal to each of the amplification paths;
- altering the phase of the signal supplied to each amplification path;
- substantially oppositely altering the phase of the signal at an output of each amplification path and with respect to each amplification path;
- transforming the impedance of the signal;
- combining the signal from each of the amplification paths into a single output;
- detecting an impedance of each of the plurality of amplification paths; and
- selecting an amplification path based on the detected impedance.

20. The method of claim 19, further comprising substantially simultaneously altering the phase and impedance of the signal.

21. The method of claim 20, further comprising performing the transformation and the phase shift on the same module on which the plurality of amplification paths are located.

22. The method of claim 19, further comprising separately altering the phase and impedance of the signal.

23. The method of claim 19, wherein under an impedance mismatch condition one amplification path has a high impedance and the other amplification path has a low impedance.

24. The method of claim 19, wherein the power combiner performs an additional impedance transformation on the signal.

* * * * *